(12) United States Patent
Nagatake et al.

(10) Patent No.: US 7,113,532 B2
(45) Date of Patent: Sep. 26, 2006

(54) SEMICONDUCTOR LASER DEVICE

(75) Inventors: Tsuyoshi Nagatake, Kanagawa (JP); Shoji Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 272 days.

(21) Appl. No.: 10/423,222

(22) Filed: Apr. 25, 2003

(65) Prior Publication Data
US 2003/0202551 A1 Oct. 30, 2003

(30) Foreign Application Priority Data
Apr. 30, 2002 (JP) .............................. 2002-127882

(51) Int. Cl.
*H01S 5/00* (2006.01)
(52) U.S. Cl. ............................................ 372/45.011
(58) Field of Classification Search ............ 372/45–46, 372/45.011
See application file for complete search history.

(56) References Cited

U.S. PATENT DOCUMENTS

| 4,034,311 A | * | 7/1977 | Itoh et al. | .............. | 372/45.012 |
| 4,512,022 A | * | 4/1985 | Tsang | ........................... | 372/45 |
| 5,644,587 A | * | 7/1997 | Kaneno et al. | ................ | 372/45 |
| 6,603,784 B1 | * | 8/2003 | Johnson | ....................... | 372/45 |

FOREIGN PATENT DOCUMENTS

| JP | 2000-101198 A | 4/2000 |
| JP | 2000-114654 A | 4/2000 |

OTHER PUBLICATIONS

A. Valster, et al., Strain-Overcompensated GaInP-AlGaInP Quantum-Well Laser Structures for Improved Reliability at High-Output Powers, IEEE Journal of Selected Topics Quantum Electronics, vol. 3, No. 2, Apr. 1997, USA.

* cited by examiner

*Primary Examiner*—James Menefee
(74) *Attorney, Agent, or Firm*—Robert J. Depke; Rocky, Depke, Lyons & Kitzinger LLC

(57) ABSTRACT

A semiconductor laser device is one of AlGaInAs semiconductor laser devices, and has a multi-layer structure with a n-GaAs substrate on which a n-$Al_{0.3}Ga_{0.7}As$ buffer layer, a n-$Al_{0.47}Ga_{0.53}As$ clad layer, active layer portion, p-$Al_{0.47}Ga_{0.53}As$ clad layer and p-GaAs cap layer are formed. The active layer portion is configured as a multi-layer structure including $(Al_{0.37}Ga_{0.63})_{0.97}In_{0.03}As$ light guide layer, $Al_{0.1}Ga_{0.9}As$ active layer and $(Al_{0.37}Ga_{0.63})_{0.97}In_{0.03}As$ light guide layer. By using the AlGaInAs layer to which In is added is used as the light guide layers, the active layer is under compressive strain. Accordingly, the lattice constant of the active layer at the laser emitting edge becomes smaller due to a force from the adjacent light guide layers. The band gap energy of the active layer near the laser emitting edge becomes larger than the inside of laser device, thereby forming the window structure.

9 Claims, 3 Drawing Sheets

LATTICE STRAIN NEAR EMITTING EDGE ($a_{ac} < a_{sub} < a_{adjacent}$)

LATTICE STRAIN NEAR EMITTING EDGE ($a_{adjacent} \leq a_{sub} < a_{ac}$)

LATTICE STRAIN NEAR EMITTING EDGE ($a_{ac} < a_{sub} < a_{adjacent}$)

SEMICONDUCTOR LASER DEVICE

This application claims priority to Japanese Patent Application Number JP2002-127882 filed Apr. 30, 2002 which are incorporated herein by reference.

BACKGROUND OF THE INVENTION

1. Field of the Invention

The present invention relates to a semiconductor laser device. Specifically, the present invention relates to a highly reliable semiconductor laser device capable of long and stable operation with a high output power.

2. Description of the Related Art

In many of recent applications of semiconductor laser devices, there is need for both higher power output and higher reliability in operation than currently available. One of reasons preventing such higher power output of the semiconductor laser device is catastrophic optical damage (COD) caused by light absorption occurred near a laser emitting edge of an active layer.

It is suspected that the COD is caused by lowering of a band gap due to relaxation of lattice strains near the laser emitting edge or surface levels existed in the laser emitting edge.

To countermeasure such COD phenomenon, various methods are proposed to suppress the light absorption near the laser emitting edge by enlarging band gap energy of the active layer region near the laser emitting edge so as that the active layer region becomes transparent to an oscillation wavelength of the laser device.

Such construction of the semiconductor laser device is referred to as, in general, a window structure laser or non absorbing mirror (NAM) structure laser. Such a structure is known to be suitable for a semiconductor laser device for generating a higher power output.

Various methods are proposed for fabricating the window structure. For example, the methods may includes a method in which semiconductor material that is transparent to an emission wavelength is epitaxially grown at the laser emitting edge, or a method in which impurities such as Zn, Si and the like are intentionally diffused in the active layer near the laser emitting edge for disordering.

SUMMARY OF THE INVENTION

However, in the method in which semiconductor material that is transparent to an emission wavelength is epitaxially grown at the laser emitting edge, a substrate on which the laser structure is fabricated is configured as so-called a bar form, and semiconductor material transparent to the laser light is epitaxially grown on the laser emitting edge of this bar laser structure. These processes in the method are technically challenging. Furthermore, an electrode forming process to be performed after these processes is very complicated, thereby driving the production cost of the semiconductor laser device higher.

Furthermore, in the method in which impurities such as Zn, Si and the like are intentionally diffused in the active layer near the laser emitting edge for disordering, typically, the impurity diffusion is initiated toward the substrate from a side to which the epitaxial growth is directed. Accordingly, it is difficult to control diffusion depth and the diffusion in a lateral direction with respect to a resonator's direction, thereby making it difficult to achieve a desirable impurity diffusion pattern. Furthermore, the method is problematic because electric resistance in the region, in which the impurity is diffused, decreases. The decrease of electric resistance causes a reactive current, and then causes increases of threshold current and/or drive current of the semiconductor laser device.

The present invention is conceived in view of problems relating to the conventional technology described above. It is desirable to provide a semiconductor laser device capable of suppressing light absorption at its laser emitting edge while providing a higher output power and higher reliability.

Attention of inventors of the present invention has been called to a report by Valster et. al (IEEE Journal of Selected Topics in Quantum Electronics, Vol. 3, No. 2, April 1997, p180–187), which discusses lattice displacements near a laser emitting edge surface. According to Valster et. al., in a system in which an active layer is under compressive strain, the lattices near the laser emitting edge of the semiconductor laser device are displaced as shown in FIG. 3 since a lattice constant $a_{ac}$ of the active layer of the semiconductor laser device becomes larger than a lattice constant $a_{sub}$ of a substrate.

Specifically, according to the above-described report, the lattice constant $a_{ac}$ of the active layer is larger than that of an epitaxially grown layer adjacent to the active layer, such as the lattice constant $a_{adjacent}$ of the light guide layer. Accordingly, as shown in FIG. 3, the lattice constant of the active layer near the laser emitting edge becomes larger than that of the active layer on the inside of laser device, where the active layer is under the compressive strain, due to relaxation of the strain near the laser emitting edge. Consequently, the band gap energy near the laser emitting edge becomes larger. In other word, the band gap near the laser emitting edge becomes smaller than that of the active layer on the inside of laser device.

Accordingly, the light absorption at the active layer near the laser emitting edge becomes larger, thereby forming a cause for triggering the COD.

The inventors of the present invention conceive the present invention to suppress the band gap decrease due to the relaxation of strain in the active layer near the laser emitting edge. In the present invention, an active layer, a substrate and an epitaxially grown layer disposed adjacent to the active layer are selectively formed in such a way that their lattice constants satisfy condition $a_{ac} < a_{sub} < a_{adjacent}$ so as that the active layer is under tensile strain as shown in FIG. 4.

According to the present invention, in spite of the tensile strain in the active layer on the inside of laser device, the tensile strain of the active layer near the laser emitting edge is relaxed and the lattice constant of the active layer becomes smaller. This is opposite to the lattice constant change observed in the laser emitting edge shown in FIG. 3. In the epitaxially grown layer adjacent to the active layer, however, the strain is relaxed and the lattice constant thereof becomes larger near the laser emitting edge although the epitaxially grown layer is under the tensile strain on the inside of laser device.

Accordingly, the band gap energy of the active layer near the laser emitting edge becomes larger in comparison with that of the active layer on the inside of laser device, thereby forming the window structure transparent to a laser light at the laser emitting edge.

Alternatively, by selecting the lattice constants of the substrate, the active layer and the epitaxially grown layer adjacent to the active layer to satisfy condition $a_{sub} < a_{ac} < a_{adjacent}$, it is expected to have a suppressing effect, in which a force that causes expansion of the lattice constant of the active layer is suppressed. Here, both the active layer and the epitaxially grown layer adjacent to the active layer are under the compressive strain on the inside of crystal. However, because of the condition $a_{ac} < a_{adjacent}$, the compressive strain applied on the lattice of the epitaxially grown layer adjacent to the active layer is relaxed near the laser emitting edge. In other word, a force, by which the lattice constant of the epitaxially grown layer near the laser emitting edge is expanded, becomes stronger. Accordingly, the band gap energy of the active layer near the laser emitting edge becomes larger than that of the active layer on the inside of laser device, thereby the light absorption by the active layer may be suppressed.

The inventors of the present invention confirm effectiveness of the window structure fabricated based on the above described novel features with experiments, and thus conceive the present invention.

According to an embodiment of the present invention, a semiconductor laser device is provided. The semiconductor laser device includes a substrate and a multi-layer structure on which a bulk semiconductor active layer or an active layer of quantum well structure is sandwiched by clad layers having a smaller refractive index but larger band gap energy than those of the active layer. Further, in the present embodiment, the lattice constant $a_{adjacent}$ of the semiconductor crystal layer adjacent to the active layer is set to be larger than the lattice constant $a_{ac}$, i.e. $a_{ac} < a_{adjacent}$.

By selecting the lattice constants of the active layer and the semiconductor crystal layer adjacent to the active layer to satisfy the condition $a_{ac} < a_{adjacent}$, tensile strain is applied on the active layer. The active layer receives the tensile strain on the inside of laser device. However, in a vicinity of the laser emitting edge, the tensile strain applied on the active layer is relaxed and the lattice constant of the active layer becomes smaller. On the other hand, the lattice constant of the semiconductor crystal layer adjacent to the active layer becomes larger.

Accordingly, the band gap energy of the active layer near the laser emitting edge becomes larger than that of the active layer on the inside of laser device, thereby forming the window structure transparent to the laser light at the laser emitting edge.

The active layer of quantum well structure may be an active layer of single quantum well structure, or an active layer of multiple quantum well structure.

In a preferred embodiment of the present invention, the lattice constant $a_{ac}$ of the active layer is less than the lattice constant $a_{sub}$ of the substrate, and the lattice constant $a_{adjacent}$ of the semiconductor crystal layer adjacent to the active layer is larger than the lattice constant $a_{sub}$ of the substrate, i.e., $a_{ac} < a_{sub} < a_{adjacent}$.

Accordingly, the tensile strain phenomenon applied on the active layer becomes more significant.

In another preferred embodiment of the present invention, the lattice constant $a_{ac}$ of the active layer is larger than the lattice constant $a_{sub}$ of the substrate, and the lattice constant $a_{adjacent}$ of the semiconductor crystal layer adjacent to the active layer is larger than the lattice constant $a_{ac}$ of the active layer, i.e., $a_{sub} < a_{ac} < a_{adjacent}$.

Accordingly, a force that causes expansion of the lattice constant of the active layer may be suppressed. Here, both the active layer and the epitaxially grown layer adjacent to the active layer are under the compressive strain on the inside of crystal. However, because of the condition $a_{ac} < a_{adjacent}$, the compressive strain applied on the lattice of the epitaxially grown layer adjacent to the active layer is relaxed near the laser emitting edge. Accordingly, a force that causes expansion of the lattice constant of the epitaxially grown layer becomes stronger. According to such configuration, the band gap energy of the active layer near the laser emitting edge becomes larger than that of the active layer on the inside of laser device, and the light absorption by the active layer may be suppressed.

In another preferred embodiment of the present invention, thickness of the semiconductor crystal layer adjacent to the active layer is not larger than a critical film thickness for the lattice constant $a_{sub}$ of the substrate or the lattice constant $a_{ac}$ of the active layer.

The semiconductor crystal layer adjacent to the active layer may be a light guide layer that has a refractive index less than that of the active layer but larger than the clad layer, and a band gap larger than that of the active layer but less than the clad layer. The semiconductor crystal layer may also be a semiconductor crystal layer having a functionality different from the light guide layer.

Furthermore, in still another preferred embodiment of the present invention, the lattice constant of the semiconductor crystal layer adjacent to the active layer may increase or decrease, continuously or step-wisely, as a vertical distance from the active layer increases, where the vertical distance is a distance normal to a substrate plane and between the semiconductor crystal layer and the active layer.

BRIEF DESCRIPTION OF THE DRAWINGS

The above and other objects, features and advantages of the present invention will become more apparent from the following description of the presently preferred exemplary embodiment of the invention taken in conjunction with the accompanying drawing, in which.

DETAILED DESCRIPTION OF THE PREFERRED EMBODIMENTS

Embodiments of the present invention are described in detail with reference to figures and embodiment examples below.

EMBODIMENT EXAMPLE 1

Figure 1:
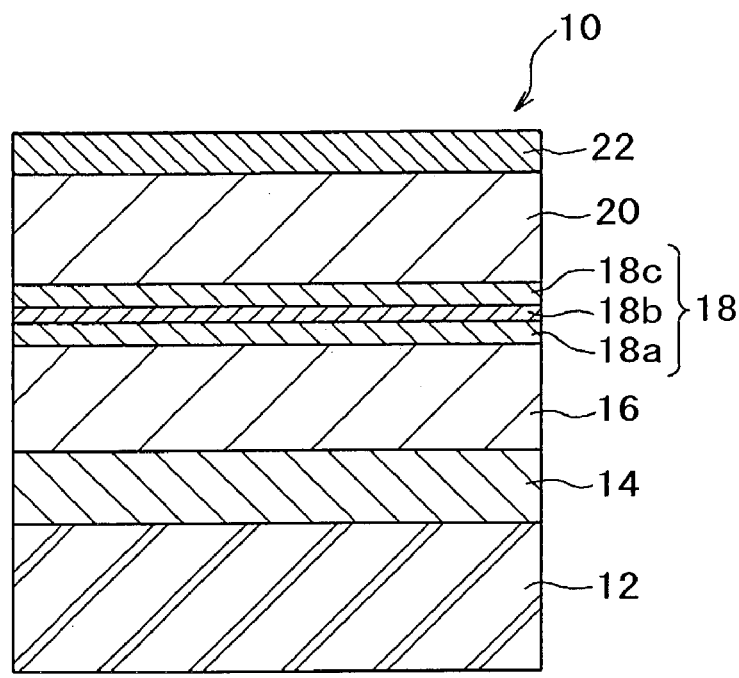
FIG. 1 is a cross sectional view showing structure of a semiconductor laser device according to an embodiment example 1.

The embodiment example is an example of a semiconductor laser device in accordance with an embodiment of the present invention. FIG. 1 is a cross sectional view showing a structure of the semiconductor laser device according to the present embodiment example.

A semiconductor laser device 10 of the present embodiment example is one of AlGaInAs semiconductor laser devices, and has a n-GaAs substrate 12 and a multi-layer structure formed thereon. The multi-layer structure includes a n-$Al_{0.3}Ga_{0.7}As$ buffer layer 14, a n-$Al_{0.47}Ga_{0.53}As$ clad layer 16, an active layer portion 18, a p-$Al_{0.47}Ga_{0.53}As$ clad layer 20 and a p-GaAs cap layer 22.

The active layer portion 18 is configured as a multi-layer structure including a $(Al_{0.37}Ga_{0.63})_{0.97}In_{0.03}As$ light guide layer 18a, a $Al_{0.1}Ga_{0.9}As$ active layer 18b and a $(Al_{0.37}Ga_{0.63})_{0.97}In_{0.03}As$ light guide layer 18c.

Film thickness of the light guide layers 18a and 18c is equal or less than a critical film thickness for a lattice constant of the n-GaAs substrate 12.

In the semiconductor laser device 10 according to the present embodiment example, the $(Al_{0.37}Ga_{0.63})_{0.97}In_{0.03}As$ layer, to which In is added, is used for the light guide layers 18a and 18c. Accordingly, the light guide layers 18a, 18c and the $Al_{0.1}Ga_{0.9}As$ active layer 18b are under compressive strain due to condition $a_{sub}<a_{ac}<a_{adjacent}$ to be satisfied.

However, the lattice strain of the light guide layers 18a and 18c is relaxed near the laser emitting edge, and a force that causes expansion of the lattice constant thereof become stronger. Accordingly, a force that causes expansion of the lattice constant of the active layer 18b may be suppressed.

Accordingly, because the lattice constant of the active layer 18b near the laser emitting edge becomes smaller than that of the active layer 18b on the inside of laser device, the band gap energy of the active layer 18b near the laser emitting edge becomes larger in comparison with that of the active layer on the inside of laser device, thereby forming the window structure at the laser emitting edge.

EMBODIMENT EXAMPLE 2

Figure 2:
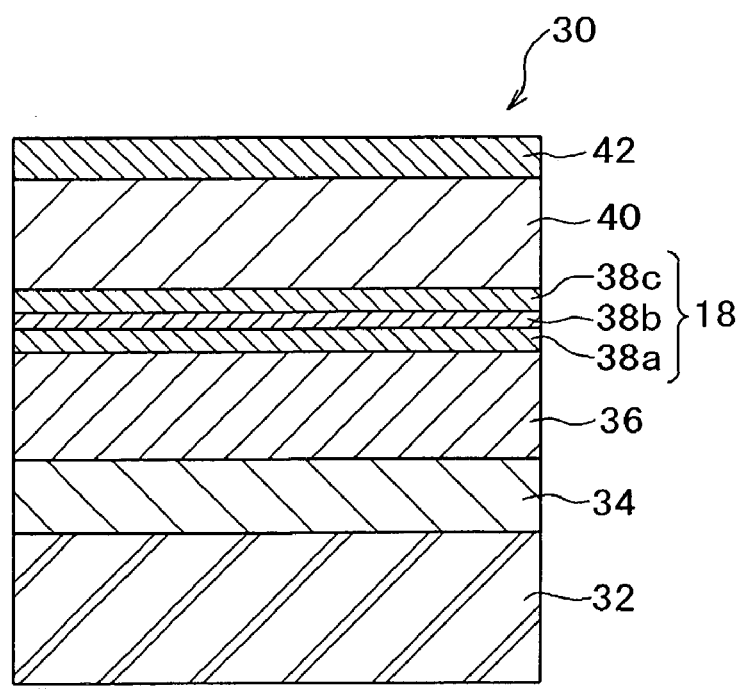
FIG. 2 is a cross sectional view showing structure of a semiconductor laser device according to an embodiment example 2.
Figure 3:
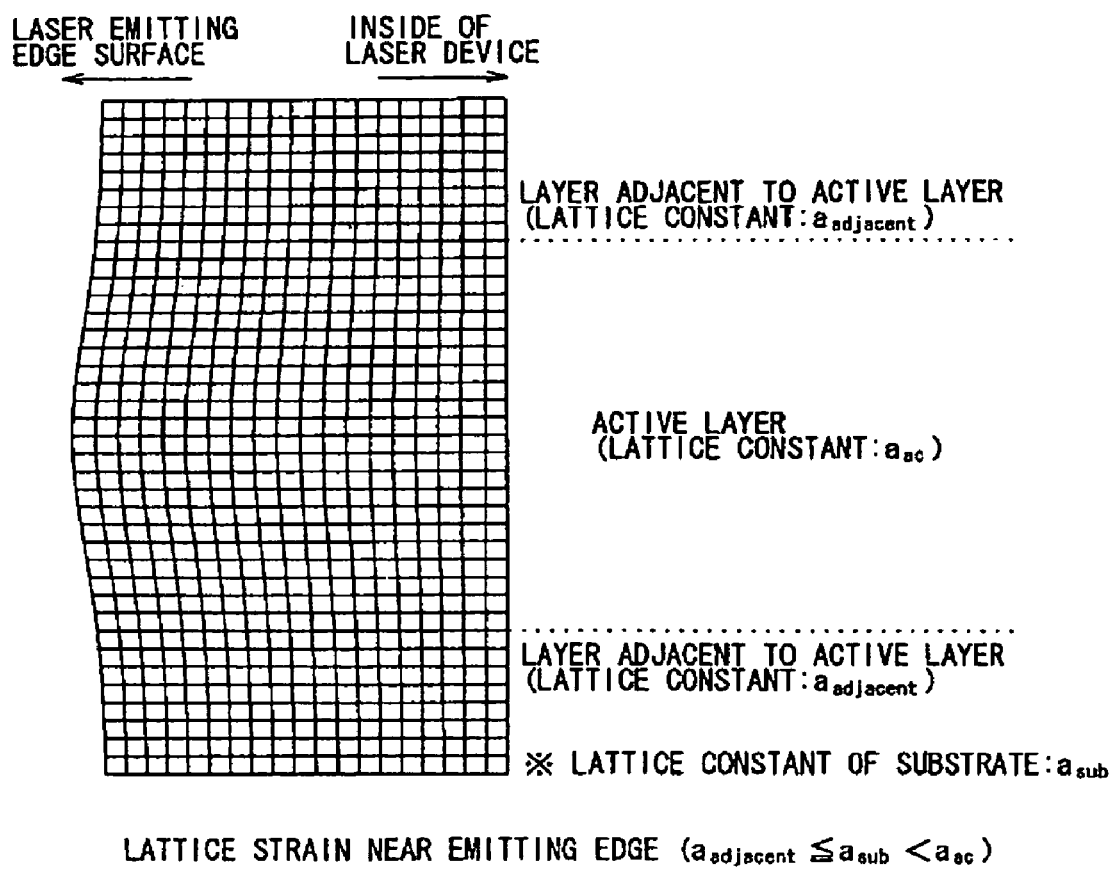
FIG. 3 is an illustration showing lattice strain condition near a laser emitting edge for $a_{adjacent} \leq a_{sub} < a_{ac}$.
Figure 4:
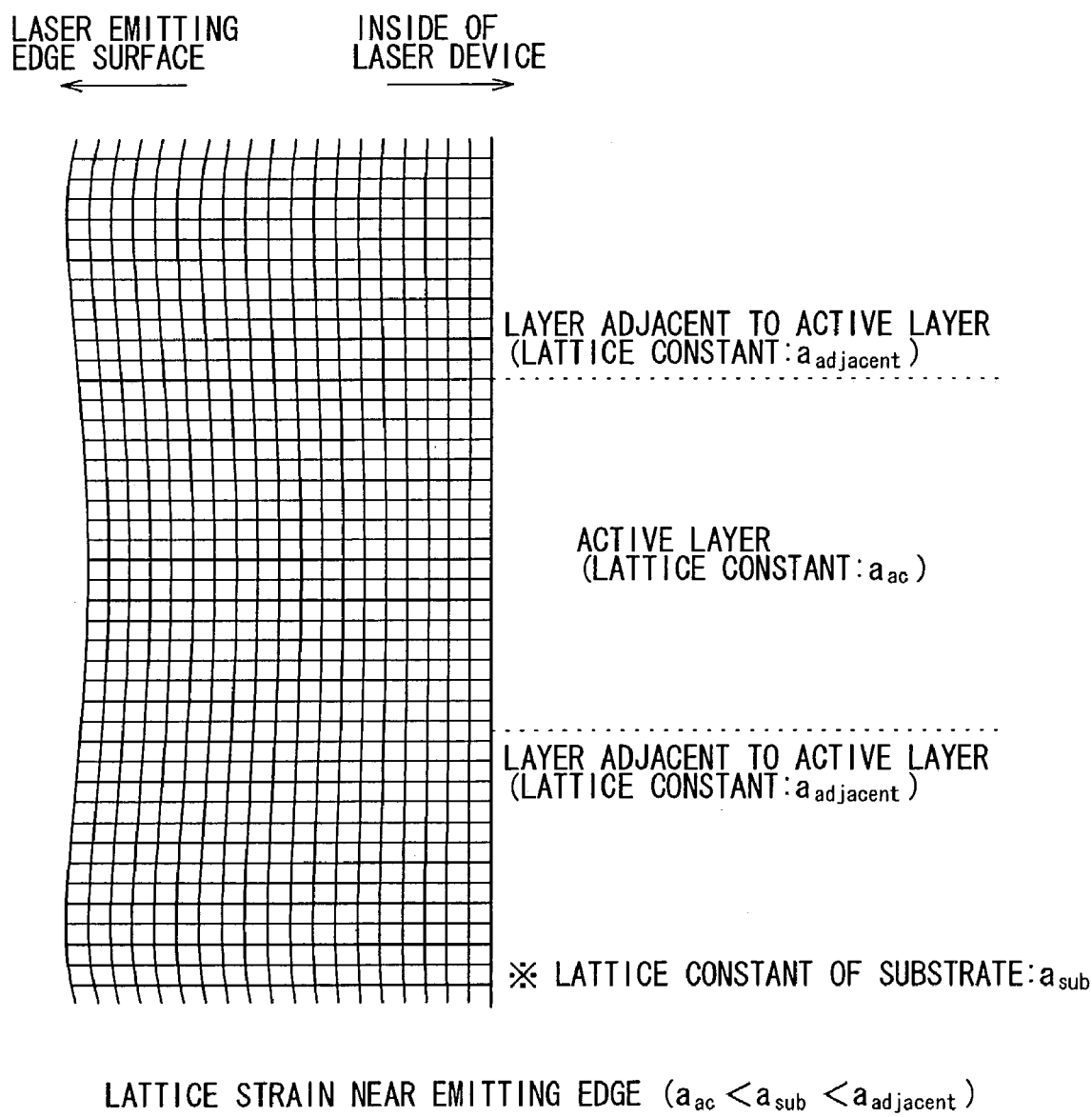
FIG. 4 is an illustration showing lattice strain condition near a laser emitting edge for $a_{ac} < a_{sub} < a_{adjacent}$.

The embodiment example is another example of a semiconductor laser device in accordance with an embodiment of the present invention. FIG. 2 is a cross sectional view showing a structure of the semiconductor laser device according to the present embodiment example.

A semiconductor laser device 30 of the present embodiment example is one of AlGaInP semiconductor laser devices, and has a n-GaAs substrate 32 and a multi-layer structure formed thereon. The multi-layer structure includes a $n-Ga_{0.52}In_{0.48}P$ buffer layer 34, a $n-(Al_{0.7}Ga_{0.3})InAs$ clad layer 36, an active layer portion 38, a $p-(Al_{0.7}Ga_{0.3})InAs$ clad layer 40 and a p-GaAs cap layer 42.

The active layer portion 38 is configured as a multi-layer structure including a $(Al_{0.4}Ga_{0.6})_{0.45}In_{0.55}P$ light guide layer 38a, a $Ga_{0.65}In_{0.35}P$ active layer 18b and a $(Al_{0.4}Ga_{0.6})_{0.45}In_{0.55}P$ light guide layer 38c.

Film thickness of the light guide layers 38a and 38c is equal or less than a critical film thickness for a lattice constant of the n-GaAs substrate 32.

In the semiconductor laser device 30 according to the present embodiment example, a In composition of the active layer 38b is 0.35, and a In composition of the light guide layers 38a and 38c is 0.55. Accordingly, due to condition $a_{ac}<a_{sub}<a_{adjacent}$ to be satisfied, the active layer 38b is under tensile strain with respect to the GaAs substrate 32 while the light guide layers 38a and 38c are under compressive strain.

However, the compressive strain of the light guide layers 38a and 38c is relaxed near the laser emitting edge, thereby increasing the lattice constant thereof. At the same time, near the laser emitting edge, the tensile strain of the active layer 38b is relaxed, thereby decreasing the lattice constant of the active layer 38b.

Accordingly, the band gap energy of the active layer 38b near the laser emitting edge becomes larger than that of the active layer 38b on the inside of laser device, thereby forming the window structure transparent to the laser light at the laser emitting edge.

In the embodiment examples 1 and 2, examples of the AlGaInAs system and the AlGaInP system are described. It should be noted that, however, the present invention is not limited only to these system, but may be applicable to any other system, such as a AlGaInN system, which is capable of introducing the strain.

Furthermore, the embodiment examples are described with the active layers of single quantum well structure (SQW). Alternatively, an active layer of multiple quantum well structure (MQW) or a bulk active layer may be utilized to obtain the similar effects as the embodiment examples described above.

The present invention allows to form the window structure at the laser emitting edge and suppress the light absorption at the laser emitting edge by selectively forming the active layer and the semiconductor crystal layer in such a way that condition $a_{ac}<a_{adjacent}$ is satisfied for the lattice constant $a_{adjacent}$ of the semiconductor crystal layer adjacent to the active layer and the lattice constant $a_{ac}$ of the active layer.

Accordingly, it is possible to provide a highly reliable semiconductor laser device capable of operating for a longer period with a higher power output.

While the present invention has been particularly shown and described with reference to preferred embodiments according to the present invention, it will be understood by those skilled in the art that any combinations or sub-combinations of the embodiments and/or other changes in form and details can be made therein without departing from the scope of the invention.

What is claimed is:

1. A semiconductor laser device comprising a substrate and a multi-layer structure formed on the substrate, the multi-layer structure configured so as that an active layer is sandwiched by clad layers having a smaller refractive index but a larger band gap energy than those of the active layer, wherein:

a lattice constant $a_{adjacent}$ of a semiconductor crystal layer adjacent to the active layer is set to be larger than a lattice constant $a_{ac}$ of the active layer ($a_{ac}<a_{adjacent}$) such that they are not substantially lattice matched; and wherein the lattice constant $a_{ac}$ of the active layer is less than a lattice constant $a_{sub}$ of the substrate such that they are not substantially lattice matched, and the lattice constant $a_{adjacent}$ of a semiconductor crystal layer adjacent to the active layer is larger than the lattice constant $a_{sub}$ of the substrate such that they are not substantially lattice matched ($a_{ac}<a_{sub}<a_{adjacent}$).

2. The semiconductor laser device according to claim 1, wherein:

the semiconductor crystal layer adjacent to the active layer is a light guide layer that has a refractive index less than that of the active layer but larger than the clad layer, and a band gap larger than that of the active layer but less than the clad layer.

3. The semiconductor laser device according to claim 1, wherein:

the lattice constant of the semiconductor crystal layer adjacent to the active layer increases or decreases, continuously or step-wisely, as a vertical distance from the active layer increases, the vertical distance being a distance normal to a substrate plane and between the semiconductor crystal layer and the active layer.

4. The semiconductor laser device according to claim 1, wherein:

thickness of the semiconductor crystal layer adjacent to the active layer is equal or less than a critical film thickness for the lattice constant $a_{sub}$ of the substrate or the lattice constant $a_{ac}$ of the active layer.

5. The semiconductor laser device according to claim 4, wherein:

the semiconductor crystal layer adjacent to the active layer is a light guide layer that has a refractive index less than that of the active layer but larger than the clad layer, and a band gap larger than that of the active layer but less than the clad layer.

6. A semiconductor laser device comprising a substrate and a multi-layer structure formed on the substrate, the multi-layer structure configured so as that an active layer is sandwiched by clad layers having a smaller refractive index but a larger band gap energy than those of the active layer, wherein:

a lattice constant $a_{adjacent}$ of a semiconductor crystal layer adjacent to the active layer is set to be larger than a lattice constant $a_{ac}$ of the active layer ($a_{ac} < a_{adjacent}$) by an amount such that they are not substantially lattice matched; and wherein the lattice constant $a_{ac}$ of the active layer is larger than a lattice constant $a_{sub}$ of the substrate by an amount such that they are not substantially lattice matched, and the lattice constant $a_{adjacent}$ of a semiconductor crystal layer adjacent to the active layer is larger than the lattice constant $a_{sub}$ of the substrate by an amount such that they are not substantially lattice matched ($a_{sub} < a_{ac} < a_{adjacent}$).

7. The semiconductor laser device according to claim 6, wherein:

thickness of the semiconductor crystal layer adjacent to the active layer is equal or less than a critical film thickness for the lattice constant $a_{sub}$ of the substrate or the lattice constant $a_{ac}$ of the active layer.

8. The semiconductor laser device according to claim 6, wherein:

the semiconductor crystal layer adjacent to the active layer is a light guide layer that has a refractive index less than that of the active layer but larger than the clad layer, and a band gap larger than that of the active layer but less than the clad layer.

9. The semiconductor laser device according to claim 6, wherein:

the lattice constant of the semiconductor crystal layer adjacent to the active layer increases or decreases, continuously or step-wisely, as a vertical distance from the active layer increases, the vertical distance being a distance normal to a substrate plane and between the semiconductor crystal layer and the active layer.

* * * * *